US006809914B2

(12) United States Patent
Edmonds et al.

(10) Patent No.: US 6,809,914 B2
(45) Date of Patent: Oct. 26, 2004

(54) USE OF DQ PINS ON A RAM MEMORY CHIP FOR A TEMPERATURE SENSING PROTOCOL

(75) Inventors: Johnathan T. Edmonds, Cary, NC (US); Jennifer Huckaby, Raleigh, NC (US); Torsten Partsch, Chapel Hill, NC (US); Matt Welch, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 10/144,579

(22) Filed: May 13, 2002

(65) Prior Publication Data

US 2003/0210506 A1 Nov. 13, 2003

(51) Int. Cl.$^7$ .............................. H02H 5/04; G11C 7/04
(52) U.S. Cl. ...................... 361/93.8; 361/93.8; 365/211
(58) Field of Search ............................. 361/93.8, 93.9, 361/99, 103; 365/211, 212, 226

(56) References Cited

U.S. PATENT DOCUMENTS

| | | | |
|---|---|---|---|
| 5,168,203 A | | 12/1992 | Tepavcevic |
| 5,278,796 A | * | 1/1994 | Tillinghast et al. ......... 365/211 |
| 5,739,651 A | | 4/1998 | Miyazawa et al. |
| 5,784,328 A | * | 7/1998 | Irrinki et al. ................ 365/222 |
| 5,805,403 A | * | 9/1998 | Chemla ....................... 361/103 |
| 5,873,053 A | * | 2/1999 | Pricer et al. ................. 702/130 |
| 5,875,142 A | * | 2/1999 | Chevallier ................... 365/212 |
| 6,259,652 B1 | | 7/2001 | Heyne et al. |
| 6,272,035 B1 | | 8/2001 | Dietrich et al. |
| 6,275,445 B1 | | 8/2001 | Dietrich et al. |
| 6,285,176 B1 | | 9/2001 | Marx et al. |
| 6,285,228 B1 | | 9/2001 | Heyne et al. |
| 6,351,167 B1 | | 2/2002 | Hein et al. |
| 6,366,527 B2 | | 4/2002 | Hein et al. |
| 6,373,768 B2 | * | 4/2002 | Woo et al. ................... 365/211 |
| 6,388,944 B2 | | 5/2002 | Schrögmeier et al. |
| 6,453,218 B1 | * | 9/2002 | Vergis ......................... 700/299 |
| 6,507,530 B1 | * | 1/2003 | Williams et al. ............ 365/226 |

| | | |
|---|---|---|
| 2001/0033523 A1 | 10/2001 | Hein et al. |
| 2001/0038566 A1 | 11/2001 | Schrogmeier et al. |
| 2002/0075707 A1 | 6/2002 | Dietrich et al. |
| 2002/0079925 A1 | 6/2002 | Dietrich et al. |
| 2002/0089319 A1 | 7/2002 | Heyne et al. |
| 2002/0093855 A1 | 7/2002 | Heyne et al. |
| 2002/0133750 A1 | 9/2002 | Dietrich et al. |
| 2002/0141279 A1 | 10/2002 | Dietrich et al. |
| 2003/0001636 A1 | 1/2003 | Partsch et al. |
| 2003/0012322 A1 | 1/2003 | Partsch et al. |

FOREIGN PATENT DOCUMENTS

EP       0 692 729 A1    1/1996

OTHER PUBLICATIONS

Patent Abstracts of Japanese Publication No. 64002015, published Jan. 6, 1989 (Japanese application No. 62158219, date of application, Jun. 25, 1987).
Patent Abstracts of Japan Publication No. 63223613, published Sep. 19, 1988 (Japanese application No. 62057125, date of application Mar. 12, 1987).
Pending Patent Application Assigned to Infineon Technologies North America Corp.: Ser. No.: 10/144,597, Filing Date: May. 13, 2002, Inventors: Alexander et al.
Pending Patent Application Asssigned to Infineon Technologies North America Corp.: Ser. No.: 10/256,539, Filing Date: Sep. 27, 2002, Inventors: Partsch et al.
Pending Patent Application Assigned to Infineon Technologies North America Corp.: Ser. No.: 10/260,919, Filing Date: Sep. 30, 2002, Inventors: Partsch et al.
U.S. patent application ser. No. 10/144,572, Partsch et al., filed May. 13, 2002.

* cited by examiner

Primary Examiner—Stephen W. Jackson
Assistant Examiner—Danny Nguyen
(74) Attorney, Agent, or Firm—Brinks Hofer Gilson & Lione

(57) ABSTRACT

A method of protecting an integrated circuit that includes sensing a temperature of an integrated circuit that has a data pin, generating a temperature data signal based on the sensing, implementing a temperature sensing protocol and supplying the temperature data signal to the data pin based on the temperature sensing protocol.

16 Claims, 5 Drawing Sheets

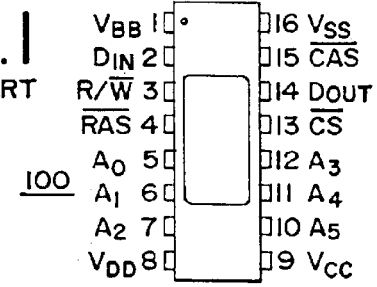
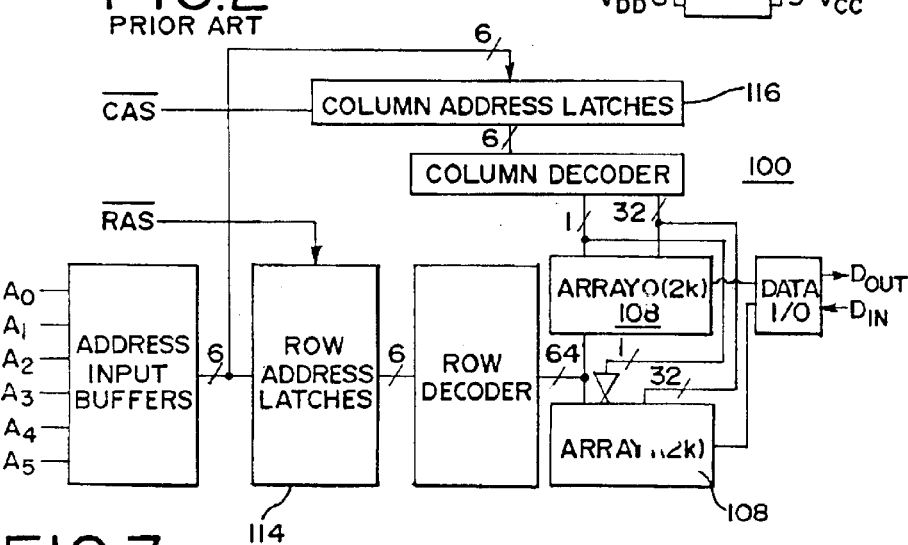
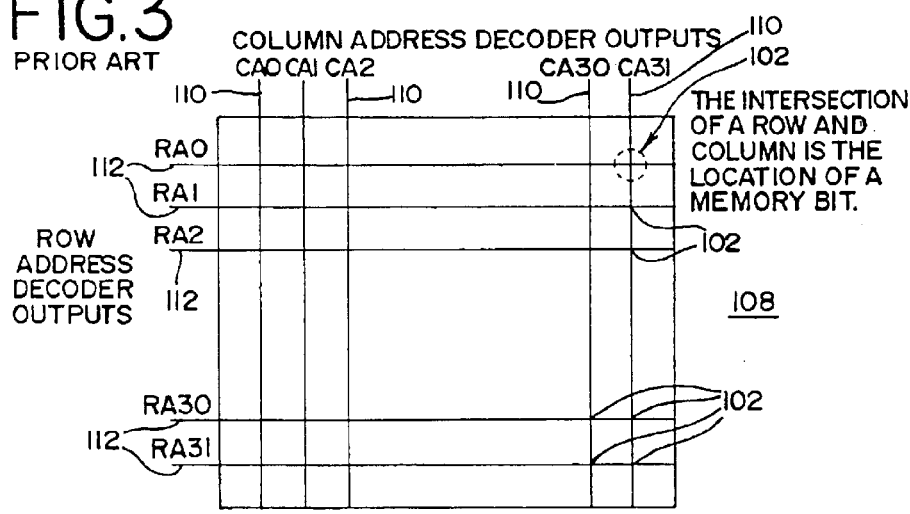

USE OF DQ PINS ON A RAM MEMORY CHIP FOR A TEMPERATURE SENSING PROTOCOL

BACKGROUND OF THE INVENTION

1. Field of the Invention

The present invention relates to the field of memory chips.

2. Discussion of Related Art

A known integrated memory IC 100 that is a writeable memory of the DRAM type is shown in FIG. 1. Such a dynamic random access memory (DRAM) chip 100 includes a plurality of memory storage cells 102 in which each cell 102 has a transistor 104 and an intrinsic capacitor 106. As shown in FIGS. 2 and 3, the memory storage cells 102 are arranged in arrays 108, wherein memory storage cells 102 in each array 108 are interconnected to one another via columns of conductors 110 and rows of conductors 112. The transistors 104 are used to charge and discharge the capacitors 106 to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has data pin Din that receives data and data pin Dout that sends data out of the memory chip 100. The modes of operation of the memory chip 100, such as Read, Write and Refresh, are well known and so there is no need to discuss them for the purpose of describing the present invention.

A variation of a DRAM chip is shown in FIGS. 5 and 6. In particular, by adding a synchronous interface between the basic core DRAM operation/circuitry of a second generation DRAM and the control coming from off-chip a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. The row address strobe (RAS) input pin receives a signal RAS that clocks the address present on the DRAM address pins A0 to A11 into the bank of row address latches 214. Similarly, a column address strobe (CAS) input pin receives a signal CAS that clocks the address present on the DRAM address pins A0 to A11 into the bank of column address latches 216. The memory chip 200 has data input/output pins DQ0–15 that receive and send input signals and output signals. The input signals are relayed from the pins DQ0–15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The modes of operation of the memory chip 200, such as Read, Write and Refresh, are well known and so there is no need to discuss them for the purpose of describing the present invention.

It is noted that new generations of SDRAM chips are being optimized for bandwidth. The most common method of accomplishing such optimization is to increase the clocking rate of SDRAM chips. By increasing the clocking rate and shortening operation cycles for normal operations, the consumption of current and power during operations increases. Since the internal temperature of the chip is proportional to the power consumption, increasing the clocking rate will result in an increase ;n the internal temperature of the chip.

It is known that there are circumstances where the heat generated in SDRAM chips optimized for bandwidth exceeds the maximum amount of heat that the chip package can dissipate. In most cases, the extent of time at which the generated heat exceeds the maximum amount of heat that can be dissipated is so short that the thermal constant of the chip package is sufficiently high in value so as to prevent destruction of the SDRAM chip.

SUMMARY OF THE INVENTION

One aspect of the present invention regards a method of protecting an integrated circuit that includes sensing a temperature of an integrated circuit that has a data pin, generating a temperature data signal based on the sensing, implementing a temperature sensing protocol and supplying the temperature data signal to the data pin based on the temperature sensing protocol.

The above aspect of the present invention provides the advantage of preventing the thermal destruction of a memory chip.

The present invention, together with attendant objects and advantages, will be best understood with reference to the detailed description below in connection with the attached drawings.

BRIEF DESCRIPTION OF THE DRAWINGS

FIG. 1 schematically shows a top view of an embodiment of a known memory chip;

FIG. 2 shows a block diagram of the memory chip of FIG. 1;

FIG. 3 schematically shows an embodiment of a memory array to be used with the memory chip of FIG. 1;

DETAILED DESCRIPTION OF THE INVENTION

Figures 4, 5:
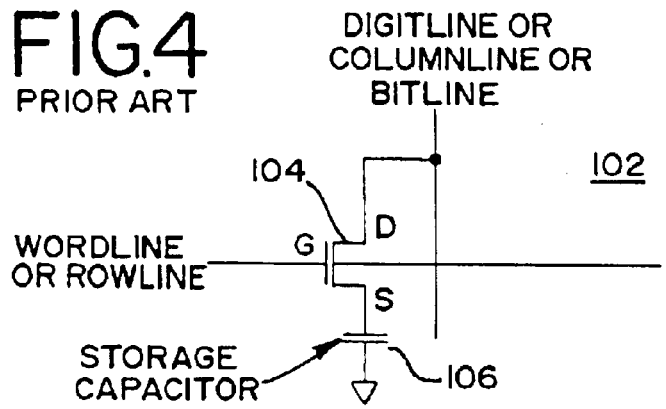
FIG. 4 schematically shows an embodiment of a memory cell to be used with the memory array of FIG. 3.
FIG. 5 schematically shows a top view of a second embodiment of a known memory chip.
Figure 6:
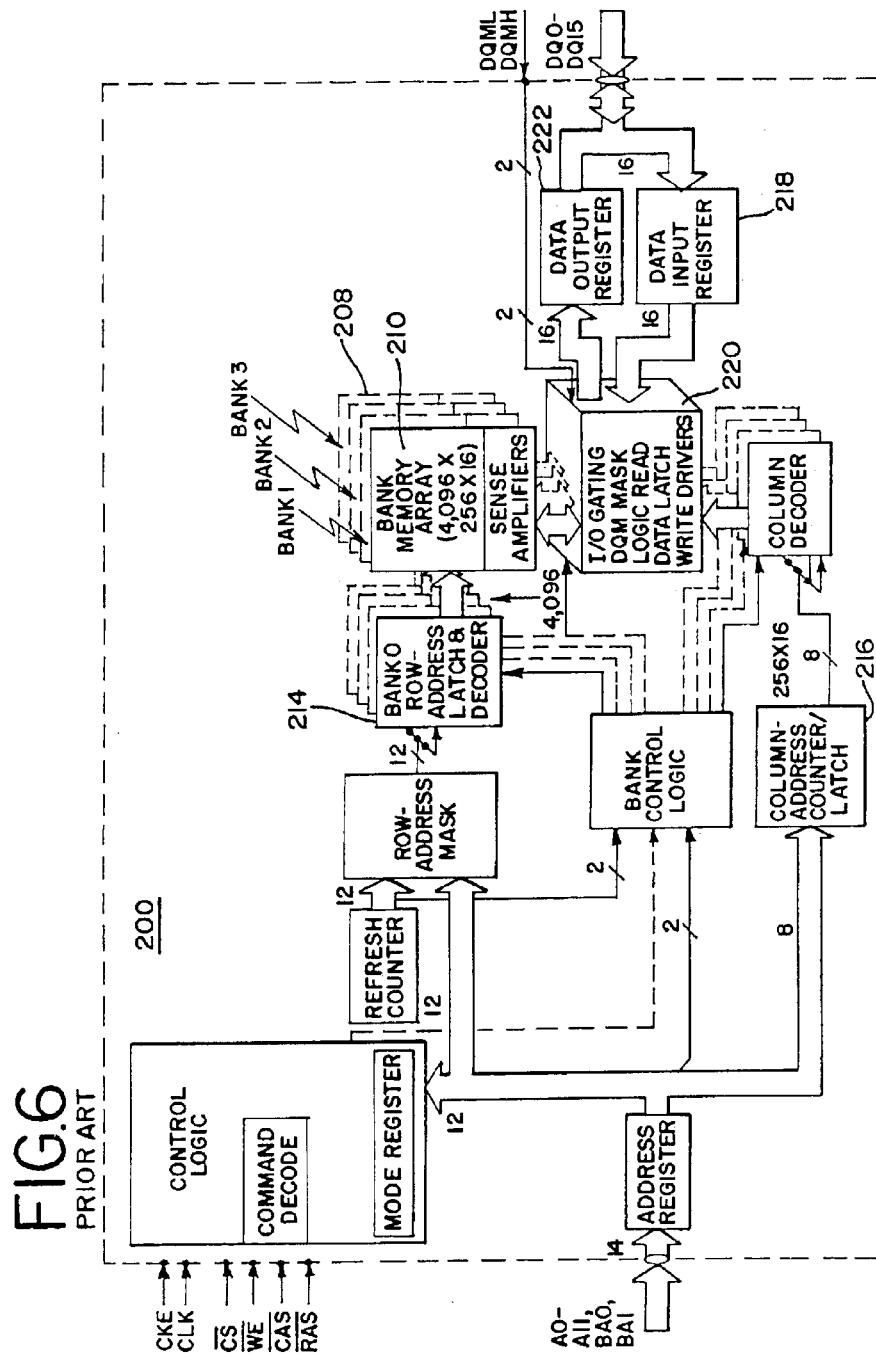
FIG. 6 shows a block diagram of the memory chip of FIG. 5.
Figure 7:
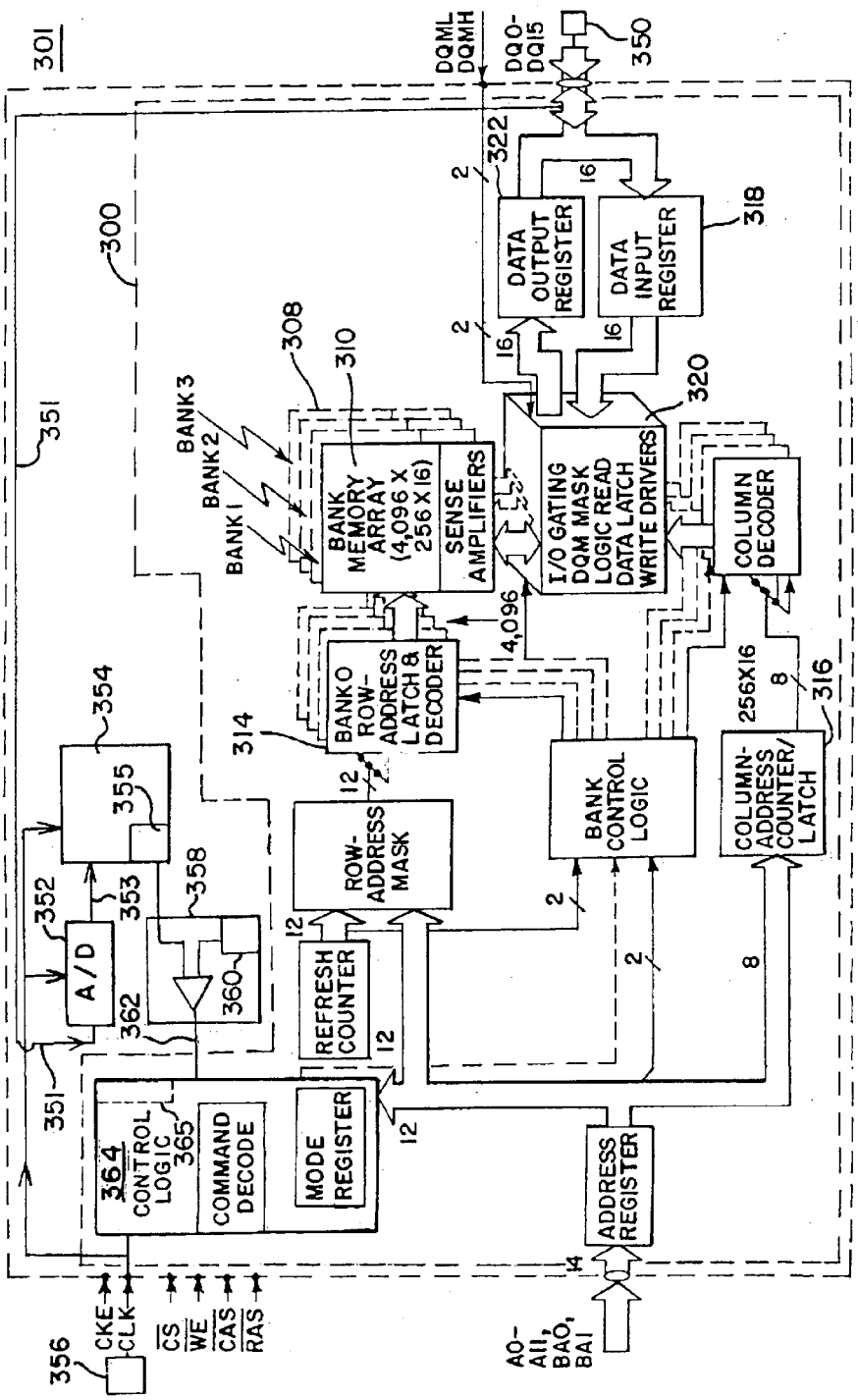
FIG. 7 schematically shows an embodiment of a thermal protection system according to the present invention.

As shown in FIG. 7, a thermal protection system 301 to be used with the present invention includes an integrated circuit, such as an SDRAM chip 300 that has a structure similar to that of the SDRAM chip 200 described previously with respect to FIGS. 5 and 6. An example of the thermal protection system 301 is disclosed in a U.S. patent application Ser. No. 10/144572 to Torsten Partsch et al., filed concurrently with the present application and entitled "Use of an On-Die Temperature Sensing Scheme for Thermal Protection of DRAMS," (Attorney Docket No. 10808/56), the entire contents of which is incorporated herein by reference.

In such a thermal protection system 301, the SDRAM chip 300 includes a bank of memory arrays 308 that include memory storage cells 310 interconnected to one another via columns and rows of conductors in a manner similar to the memory arrays 208 and memory storage cells 210 discussed previously. The memory chip 300 includes twelve address input contact pins A0–A11, row address strobe (RAS) input pin, column address strobe (CAS) input pin and data input/output pins DQ0–15 that receive and output signals in the same manner as their counterparts in the SDRAM chip 200 discussed previously. It should be noted that the present invention could be used with other types of memory chips, such as other types of semiconductor integrated circuits and other types of memory devices, such as SDRAMS and DDR SDRAMS.

The signals associated with the input contact pins A0–A11 are fed to a bank of row address latches 314 and a bank of column address latches 316 that correspond to and operate in the same manner as the latches 214 and 216, respectively. The signals associated with the data input/output pins DQ0–15 are relayed to or from data input register 318, data output register 322 and DQM processing component 320 that correspond to and operate in the same manner as registers 218, 222 and DQM processing component 220, respectively. Note that the DQM processing component 320 includes read data latches and write data latches.

Figure 8:
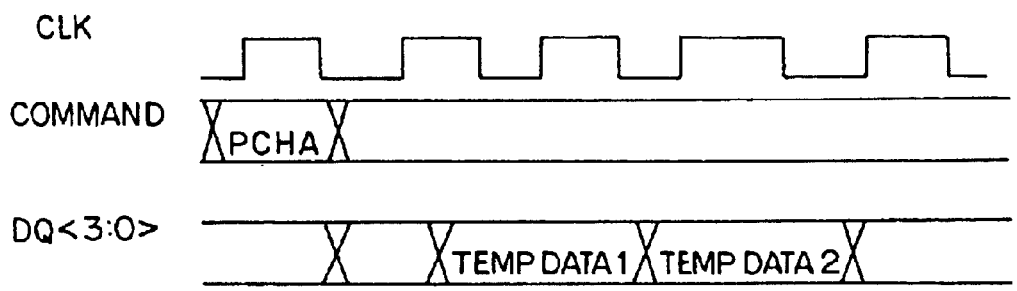
FIG. 8 shows a timing diagram for an embodiment of a temperature sensing protocol to be used with the thermal protection system of FIG. 7 according to the present invention.
Figure 9:
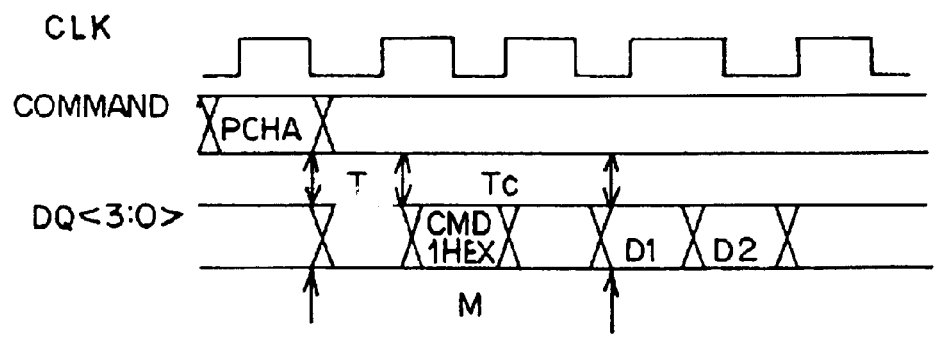
FIG. 9 shows a timing diagram for a second embodiment of a temperature sensing protocol to be used with the thermal protection system of FIG. 7 according to the present invention.
Figure 10:
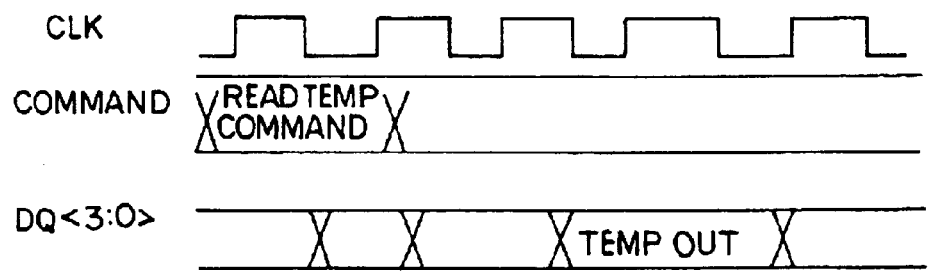
FIG. 10 shows a timing diagram for a third embodiment of a temperature sensing protocol to be used with the thermal protection system of FIG. 7 according to the present invention.

As shown in FIG. 7, the thermal protection system 301 further includes a temperature sensor 350 that is attached to the die of the SDRAM chip 300 and centrally positioned on the SDRAM chip 300 and may be connected to a power bus or a temperature sensitive net so as to sense a real time temperature of the SDRAM chip 300. The sensor 350 can be activated at all times or at distinct times designated by the system. Note that a variety of known sensors, such as a wheatstone bridge, would be acceptable for the temperature sensor 350. The temperature sensor 350 generates an analog signal $T_{analogreal}$ representative of the sensed real time temperature and the signal 351, $T_{analogreal}$, is sent to an analog-to-digital converter 352 where it is digitized. The digitized signal 353, $T_{digitalreal}$, is then sent both to a DQ pin and to a register 354 where its value is stored in a memory 355 thereof. The analog-to-digital converter 352 and the register 354 are run by clock signals sent by a clock 356 that may be a system clock of the memory chip 300. Note that one advantage of the present invention is that no additional pins for the memory chip 300 are needed The value $T_{digitalreal}$ of the sensed real time temperature is then sent to a comparator 358 that is connected to the register 354. As shown in FIGS. 8–10, the sensed real time temperature $T_{digitalreal}$ is sent from the DQ pin to the comparator 358 per a temperature sensing protocol generated by protocol component 365 of the control system 364. By using a temperature sensing protocal the control system 364 will be able to receive the sensed real time temperature via the DQ bus.

One example of a temperature sensing protocol is shown in FIG. 8. In this example, an existing command that does not require DQ bus activity is used to signal that a temperature sensing protocol is to proceed. An example of such a command is a valid command, such as the PRE-CHARGE ALL (PCHA) command. The temperature sensing protocol is engaged when the command is activated at a time when the DQ bus has no activity. In such a case, completion of the command results in temperature data corresponding to the sensed real time temperature $T_{digitalreal}$ being placed on the DQ bus after a time Δt as measured from the discontinuation of the command. The temperature data is then fed to the comparator 358 at a rate equal to the clock frequency and continues until a set time in the protocol has elapsed. The elapsed time has a magnitude, such as one or two clock pulse periods, sufficient to ensure that the data is validated, read and stopped. Placing of the temperature data on the DQ bus is continued after receipt of another PRE-CHARGE ALL command.

A second example of a temperature sensing protocol is shown in FIG. 9. Again an existing command that does not require DQ bus activity, such as PRE-CHARGE ALL, is used to signal that a temperature sensing protocol is to, proceed. The second temperature sensing protocol is engaged when the command is activated at a time when the DQ bus has no activity. After a time $Δt_1$ as measured from the discontinuation of the command, a read command R regarding a DQ pin is sent on the DQ bus. The combination and timing of the command and the read command R signals is interpreted as a temperature sensing command which results in temperature data corresponding to the sensed real time temperature $T_{digitalreal}$ being placed on the DQ bus after a time $Δt_2$ as measured from the discontinuation of the read command R. The temperature data is then fed to the comparator 358 at a rate equal to the cock frequency and continues until it is validated, read, and stopped. Placing of the temperature data on the DQ bus is continued after receipt of another PRE-CHARGE ALL command and Read command.

A third example of a temperature sensing protocol is shown in FIG. 10. In this example, a new temperature sensing command is implemented. The new command is stored in a command registry located in the control system 364. The new command is implemented when there is no DQ bus activity. After a time Δt as measured from the discontinuation of the new command, temperature data corresponding to the sensed real time temperature $T_{digitalreal}$ is placed on the DQ bus. The temperature data is then fed to the comparator 358 at a rate equal to the clock frequency and continues until it is validated, read and stopped. Placing of the temperature data on the DQ bus is continued after receipt of another new temperature sensing command.

In each of the protocols described above with respect to FIGS. 8–10, the commands are triggered by the system. The widths of the commands and the Δt's can have a variety of values ranging from two to sixteen clock cycles.

The comparator 358 includes a memory 360 that stores a threshold temperature $T_{threshold}$ that corresponds to a maximum tolerable temperature, such as 55° C., for the memory chip 300. The maximum tolerable temperature has a value that ranges from 55° C. to 75° C. depending on the heat dissipation properties of the memory chip. The comparator 358 compares the value of $T_{digitalreal}$ with the value of the threshold temperature $T_{threshold}$ and generates a comparison signal 362 that indicates whether or not the value of $T_{digitalreal}$ exceeds the value of $T_{threshold}$.

As shown in FIG. 7, the comparison signal 362 is sent to a control system 364 that is connected to the memory chip 300. The control system 364 controls operation of the memory chip 300 based on the comparison signal 362 by either shutting down the memory chip 300 or reducing power consumption of the memory chip 300 in the manner described in a U.S. patent application Ser. No. 10/144572 to Torsten Partsch et al., filed concurrently with the present application and entitled "Use of an On-Die Temperature Sensing Scheme for Thermal Protection of DRAMS," (Attorney Docket No. 10808/56), the entire contents of which is incorporated herein by reference.

The foregoing description is provided to illustrate the invention, and is not to be construed as a limitation. Numerous additions, substitutions and other changes can be made to the invention without departing from its scope as set forth in the appended claims.

We claim:

1. A method of protecting an integrated circuit, said integrated circuit comprising a data pin for receiving and sending input signals and output signals relating to the operation of said integrated circuit, said method comprising the step of:

sensing a temperature of said integrated circuit;

generating a temperature data signal based on said sensing;

implementing a temperature sensing protocol permitting supplying said temperature data signal to said data pin in addition to said input and output signals, wherein said implementing a temperature sensing protocol comprises:

generating a command; and placing said temperature data signal on a data bus of said integrated circuit that is connected to said data pin after a time Δt as measured from a moment of discontinuation of said command; and supplying said temperature data signal to said data pin based on said temperature sensing protocol.

2. The method of claim 1, further comprising:

comparing said temperature data signal supplied to said data pin with a threshold temperature; and controlling operation of said integrated circuit based on said comparing.

3. The method of claim 2, wherein said threshold temperature corresponds to a maximum tolerable temperature for said integrated circuit.

4. The method of claim 2, wherein said controlling comprises shutting down said integrated circuit based on said comparing.

5. The method of claim 2, wherein said controlling comprises reducing power consumption by said integrated circuit based on said comparing.

6. The method of claim 1, wherein said generating is performed when there is no activity of a data bus of said integrated circuit that is connected to said data pin.

7. The method of claim 1, wherein said generated command does not require activity on said data bus.

8. The method of claim 7, wherein said integrated circuit is a memory chip.

9. The method of claim 8, wherein said generated command is a PRE-CHARGE ALL command.

10. The method of claim 8, further comprising discontinuing said placing when said data temperature signal is validated, read and stopped.

11. A method of protecting an integrated circuit, said integrated circuit comprising a data pin for receiving and sending input signals and output signals relating to the operation of said integrated circuit, said method comprising the steps of:

sensing a temperature of said integrated circuit;

generating a temperature data signal based on said sensing;

implementing a temperature sensing protocol permitting supplying said temperature data signal to said data pin in addition to said input and output signals, wherein said implementing a temperature sensing protocol comprises:

generating a command;

generating a read command after a time $\Delta A_1$ as measured from a moment of discontinuation of said command;

placing said temperature data signal on said data bus after a time $\Delta t_2$ as measured from a moment of discontinuation of said read command; and supplying said temperature data signal to said data pin based on said temperature sensing protocol.

12. The method of claim 11, wherein said generating is performed when there is no activity of a data bus of said integrated circuit that is connected to said data pin.

13. The method of claim 11, wherein said generated command does not require activity on said data bus.

14. The method of claim 11, wherein said integrated circuit is a memory chip.

15. The method of claim 14, wherein said generated command is a PRE-CHARGE ALL command.

16. The method of claim 14, further comprising discontinuing said placing when said data temperature signal is validated, read and stopped.

* * * * *